United States Patent
Hoang et al.

(10) Patent No.: US 7,276,937 B2
(45) Date of Patent: Oct. 2, 2007

(54) MODULAR INTERCONNECT CIRCUITRY FOR MULTI-CHANNEL TRANSCEIVER CLOCK SIGNALS

(75) Inventors: Tim Tri Hoang, San Jose, CA (US); Sergey Yuryevich Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 148 days.

(21) Appl. No.: 11/270,718

(22) Filed: Nov. 8, 2005

(65) Prior Publication Data
US 2007/0018863 A1    Jan. 25, 2007

Related U.S. Application Data

(60) Provisional application No. 60/700,858, filed on Jul. 19, 2005.

(51) Int. Cl.
*H03K 19/177*    (2006.01)
(52) U.S. Cl. .......................................... 326/41; 326/93

(58) Field of Classification Search ................. 326/37, 326/39, 41, 93
See application file for complete search history.

(56) References Cited

U.S. PATENT DOCUMENTS

| 5,627,480 | A | | 5/1997 | Young et al. |
|---|---|---|---|---|
| 5,642,058 | A | | 6/1997 | Trimberger et al. |
| 5,649,176 | A | * | 7/1997 | Selvidge et al. ............ 713/400 |
| 6,867,616 | B1 | * | 3/2005 | Venkata et al. ............... 326/41 |
| 7,049,846 | B1 | * | 5/2006 | Kundu ........................ 326/41 |

* cited by examiner

*Primary Examiner*—James H. Cho
(74) *Attorney, Agent, or Firm*—Fish & Neave IP Group; Robert R. Jackson

(57) ABSTRACT

Circuitry for distributing clock signals (e.g., reference clock signals) among a plurality of blocks of circuitry. Each block may include reference clock source circuitry and reference clock utilization circuitry. Each block also preferably includes an identical or substantially identical module of clock signal distribution circuitry that can (1) accept a signal from the source circuitry in that block, (2) apply any of several clock signals to the utilization circuitry in that block, and (3) connect to the similar module(s) of one or more adjacent blocks.

20 Claims, 4 Drawing Sheets

US 7,276,937 B2

MODULAR INTERCONNECT CIRCUITRY FOR MULTI-CHANNEL TRANSCEIVER CLOCK SIGNALS

This application claims the benefit of U.S. provisional patent application No. 60/700,858, filed Jul. 19, 2005, which is hereby incorporated by reference herein in its entirety.

BACKGROUND OF THE INVENTION

This invention relates to integrated circuit devices such as field-programmable gate arrays ("FPGAs"), and more particularly to circuitry on FPGAs that can be used to transmit and/or receive data signals in multiple channels.

An integrated circuit such as an FPGA may be provided with multiple channels of circuitry for transmitting and/or receiving data signals. These channels may be grouped into several groups of channels. Each group may receive a reference clock signal. For greater flexibility of use of the circuitry, it may be desirable to be able to use the reference clock signal received by any of the groups in that group and/or in any other(s) of the groups. Any such distribution or sharing of clock signals among the groups is preferably done as efficiently as possible. This is aided by performing the clock signal distribution within the circuitry of the groups. It is also desirable for the circuitry of all of the groups to be the same or substantially the same, e.g., because this facilitates design and verification. And it is desirable for the groups to be as close together as possible, e.g., to conserve "real estate" on the integrated circuit, to avoid interconnections that are longer than necessary, etc. Improved clock interconnection or distribution circuitry that will help satisfy criteria such as these is needed.

SUMMARY OF THE INVENTION

In accordance with this invention, circuitry is provided for distributing clock signals among blocks of circuitry, each of which may contribute a clock signal for distribution, and each of which may be a utilizer of a distributed clock signal. Each of the blocks includes a module of the clock signal distribution circuitry. The modules in all of the blocks are preferably identical or substantially identical to one another, e.g., with respect to how they receive a clock signal for distribution and how they connect to the modules in other adjacent blocks.

Further features of the invention, its nature and various advantages, will be more apparent from the accompanying drawings and the following detailed description.

BRIEF DESCRIPTION OF THE DRAWING

FIG. 4 is intended to highlight various aspects of the invention for purposes of discussion.

DETAILED DESCRIPTION

Figure 1:
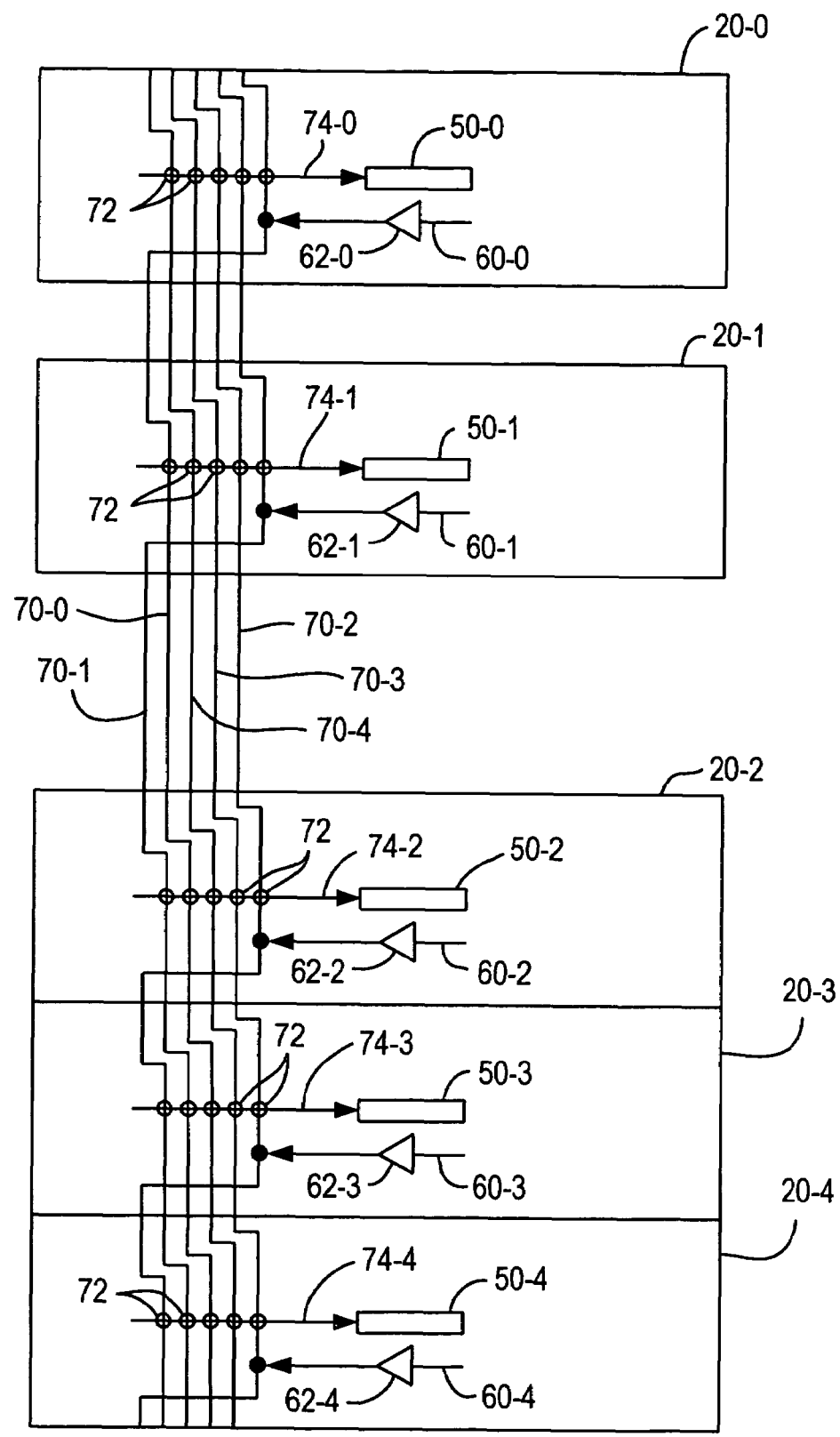
FIG. 1 is a simplified schematic block diagram of an illustrative embodiment of the invention.

FIG. 1 shows several "quads" 20 of data transmitter and/or receiver circuitry that can be included on an integrated circuit such as an FPGA. As is shown in somewhat more detail in FIG. 2, each quad 20 includes four channels of high-speed serial interface ("HSSI") circuitry 30 and one or more (e.g., up to three) units of clock management ("CMU") circuitry 40. Each channel 30 may include transmitter and/or receiver circuitry (preferably both). For example, a channel 30 may be able to receive a serial data signal, recover from that signal a recovered clock signal and a retimed data signal, convert the serial retimed data signal to a plurality of parallel data signals (e.g., a parallel byte or word), and pass the parallel data on to other circuitry of the device (e.g., the programmable logic core circuitry of the device in the case of an FPGA). Alternatively or in addition, each channel 30 may be able to accept (e.g., from core circuitry) successive bytes or words of data in parallel, to serialize that data, and to transmit it in serial form.

The channels 30 in a quad 20 may operate more or less independently of one another, or they may operate together to some degree (e.g., as in the case of multi-channel serial data communication in which the data in the various channels must ultimately be synchronized across the various channels in order to be correctly interpreted). Similarly, the various quads 20 may operate more or less independently of one another, or they may operate together to some degree (e.g., as in the case of the type of multi-channel communication that is mentioned above and that involves more than four channels of serial data.

Throughout this specification the number of channels 30 shown in a quad (or block or group) 20 is only illustrative, and it will be understood fewer than four or more than four channels 30 can be included in a quad, group, or block 20. Similarly, although each channel 30 is generally described herein as a transceiver (including both transmitter and receiver circuitry), it will be understood that some channels may be only receivers, some may be only transmitters, and/or some may be transceivers, in any desired combination. Also, not all circuitry in all channels 30 and/or in all quads 20 may be in use in any given application of the device. The number of quads 20 on a device can differ from the number (five) shown in FIG. 1. That number can be more than five or less than five (although this invention addresses cases in which the number of quads 20 is at least two, and preferably at least three).

To perform functions of the type(s) mentioned above, channels 30 need clock signals. For example, to recover data from a received serial signal, a channel 30 may need one or more clock signals from which to select or construct a clock signal having the best phase/frequency for use in sampling the received signal to capture each successive bit in that received signal. As another example, to convert parallel data to serial data for transmission, a channel 30 may need a clock signal for clocking the serial data out of the channel.

Some one or more of the clock signals needed by channels 30 may be supplied by phase-locked loop ("PLL") circuitry 50 in the CMU 40 of the quad 20 that includes those channels. It may also be possible for the quads to share some or all of the clock signals produced by their PLLs 50. Clock distribution circuitry (not shown) may extend between quads 20 for allowing a clock signal from a PLL 50 in one quad 20 to be used by channels 30 in another quad 20.

Each PLL circuit 50 typically uses a reference clock signal to produce one or more versions of that signal, or one or more signals that are at least based to some extent on the reference clock signal. For example, the PLL output signal or signals may be "cleaned-up" versions of the reference clock signal, or they may be one or more versions of the reference clock signal that are shifted in phase and/or frequency relative to the phase and/or frequency of the reference clock signal.

Figure 2:
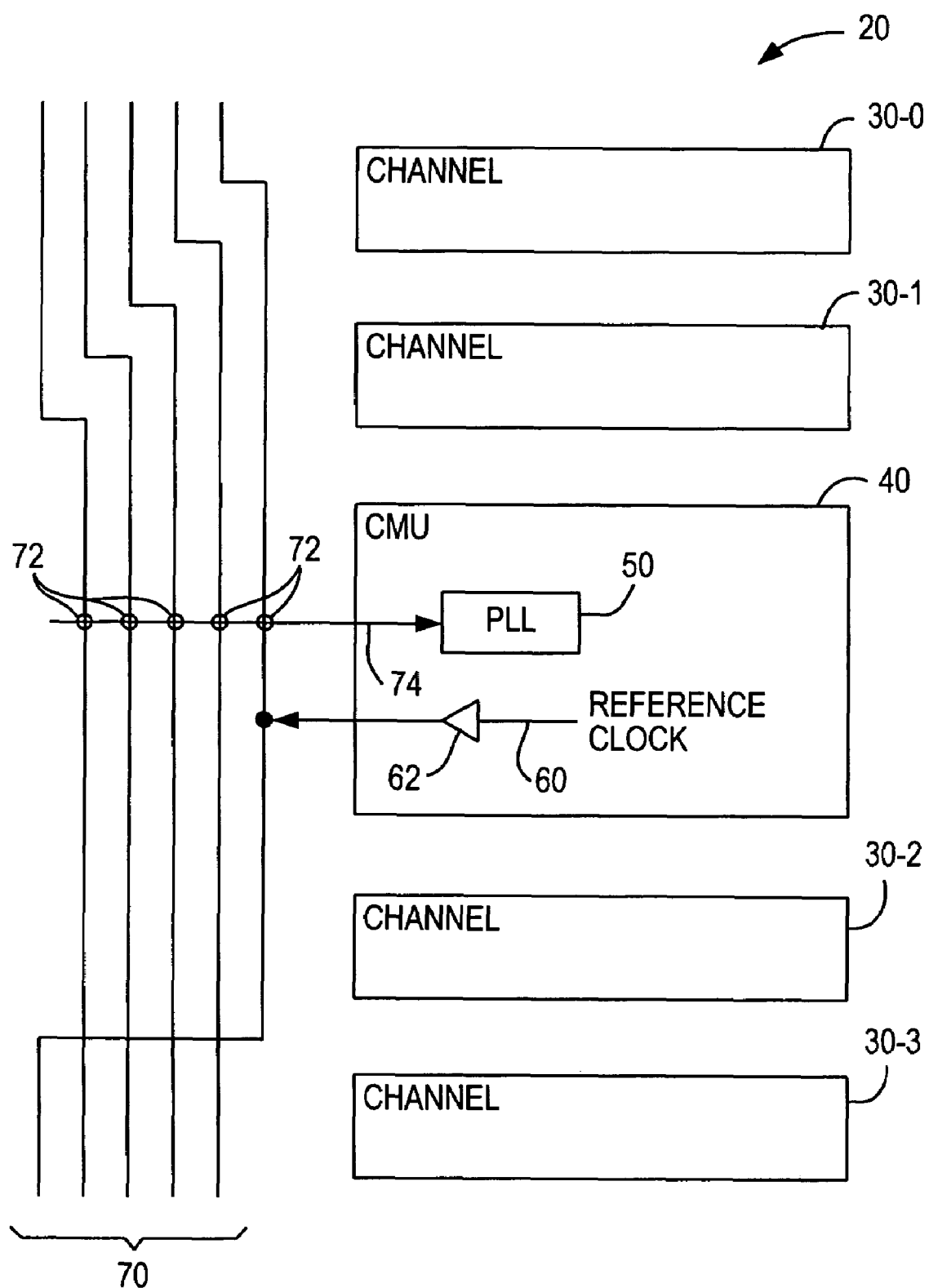
FIG. 2 is a simplified schematic block diagram showing a representative portion of what is shown in FIG. 1 in somewhat more detail.

To provide reference clock signals for PLLs 50, each CMU 40 includes reference clock input circuitry 60/62. For example, each lead or path 60 may come from a respectively associated reference clock input pin or pair of differential input pins. Buffer 62 strengthens the incoming reference clock signal and applies it to a respective one of reference clock distribution conductors 70. Each conductor 70 extends to several of quads 20, and a PLL 50 in any quad 20 can get the reference clock signal it needs from any of the adjacent conductors 70. In particular, FIGS. 1 and 2 show programmable connections 72 for allowing a PLL input conductor 74 to be selectively (programmably) connected to any one of the adjacent conductors 70.

There are a number of reasons why it may be desirable to allow a PLL 50 to be able to get its reference clock signal from any of several reference clock inputs 60. This includes allowing a PLL 50 in one quad 20 to be able to get its reference clock signal from a reference clock input 60 in another quad 20. For example, it may be desirable for two or more PLLs 50 to use one common reference clock signal. Or each PLL 50 may actually include several more or less separate PLL circuits, each needing a separate reference clock signal. This may increase the number of PLLs in each CMU 40 beyond the number for which separate reference clock input pins and circuitry 60/62 can be conveniently provided in each CMU.

On the other hand, if reference clock signals are going to be shared or distributed among several quads 20, then it is desirable for this to be done in the highly efficient manner that is provided in accordance with this invention as will now be described.

One advantageous feature of the reference clock signal distribution circuitry of this invention is that it is the same or substantially the same within each quad 20. Another advantageous feature is that the reference clock signal from the circuitry 60/62 in each quad 20 can be applied to the reference clock signal distribution circuitry within the quad. In the illustrative embodiment shown in the FIGS., the incoming reference clock signal 60/62 in each quad 20 is applied to a conductor 70 which is, at that general location, the right-most one of conductors 70. Above that location, all of conductors 70 shift one conductor track to the left. Below that location, the right-most conductor 70 crosses under or over the other conductors to become the left-most conductor.

The above-described arrangement of conductors 70 allows the conductors at the bottom of each quad 20 to be connected directly to the conductors at the top of the quad below. No space is required between quads 20 to allow any shifting or shuffling of the conductors to achieve desired alignment of and connection between vertically adjacent conductor segments. Similarly, no space is required outside of (e.g., between) quads 20 within which to make connections from elements 60/62 to proper ones of conductors 70. That can all be done in exactly the same way within each quad. In sum, each quad 20 can include an identical module or segment of reference clock signal distribution circuitry 70. Yet despite this identical nature of the modules, there is no contention of the signals applied to the several conductors 70 even when the modules in different quads are connected to one another. Each reference clock signal has its own conductor 70 that runs past all of quads 20.

Among the advantages of the invention are simplified circuit design and verification, more nearly uniform handling and behavior of all reference clock signals, more efficient use of space on the device, etc. Sometimes, for other reasons, there may be space between adjacent quads 20 (e.g., as shown in FIG. 1 between quads 20-0 and 20-1, and between quads 20-1 and 20-2). In other instances, however, there does not need to be such space (e.g., as between quads 20-2 through 20-4 in FIG. 1), and it is then that it is particularly advantageous not to have to go outside a quad to make a reference clock input connection 60/62 to a particular conductor 70, or to provide shifting or shuffling of conductors 70.

Figure 3:
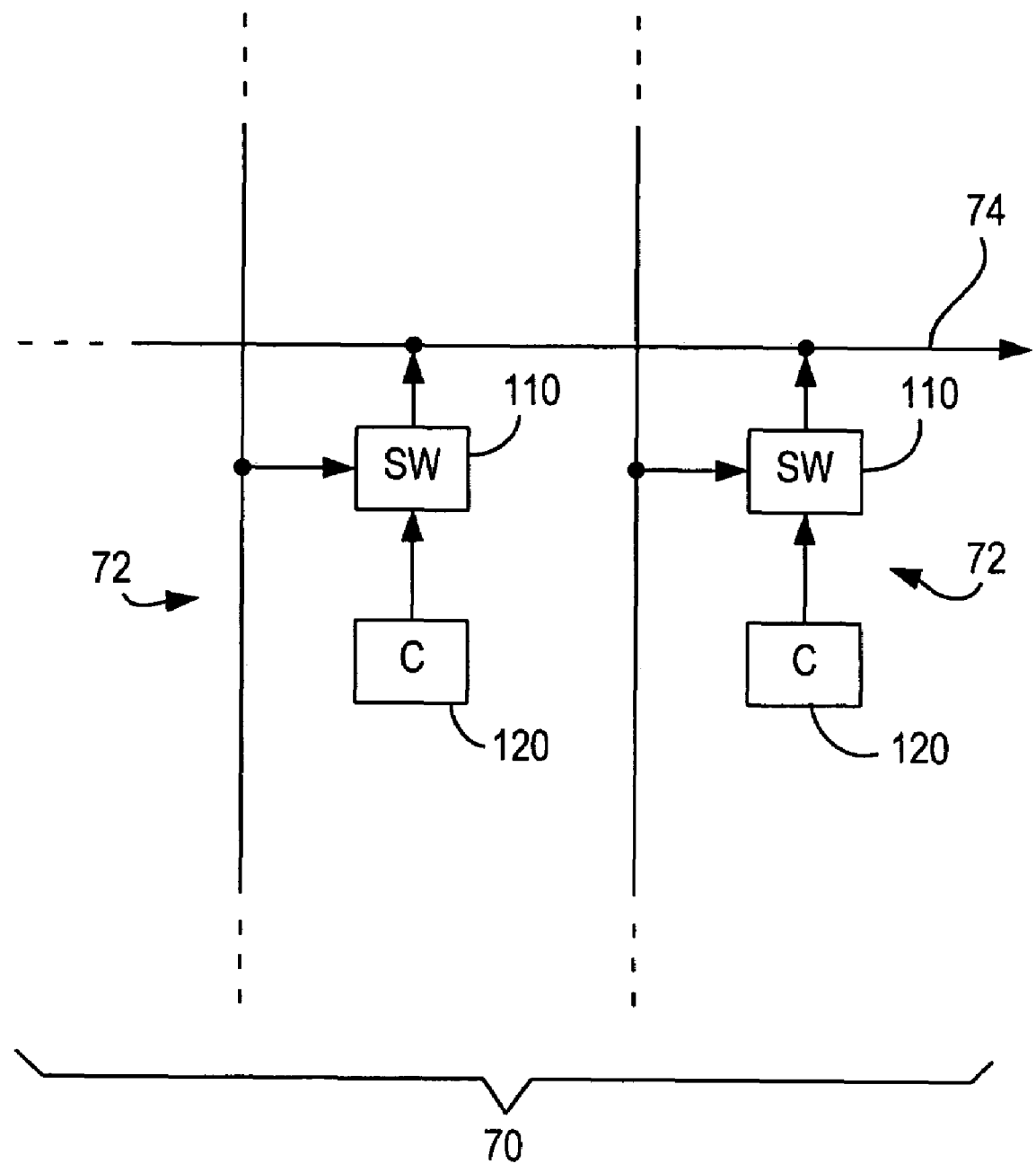
FIG. 3 is a simplified block diagram showing a representative portion of what is shown in FIGS. 1 and 2 in more detail.

FIG. 3 shows an illustrative embodiment of some representative programmable connections 72. As shown in FIG. 3, each such connection may include a switch 110 (e.g., a transistor) for selectively connecting an associated conductor 70 to an associated conductor 74. Each switch 110 is controlled by an associated control circuit element 120 such as a programmable configuration random access memory ("CRAM") bit. Each switch 110 is either on (making a connection between the associated conductors 70 and 72) or off (not making that connection), depending on the state of the associated control element 120.

Figure 4:
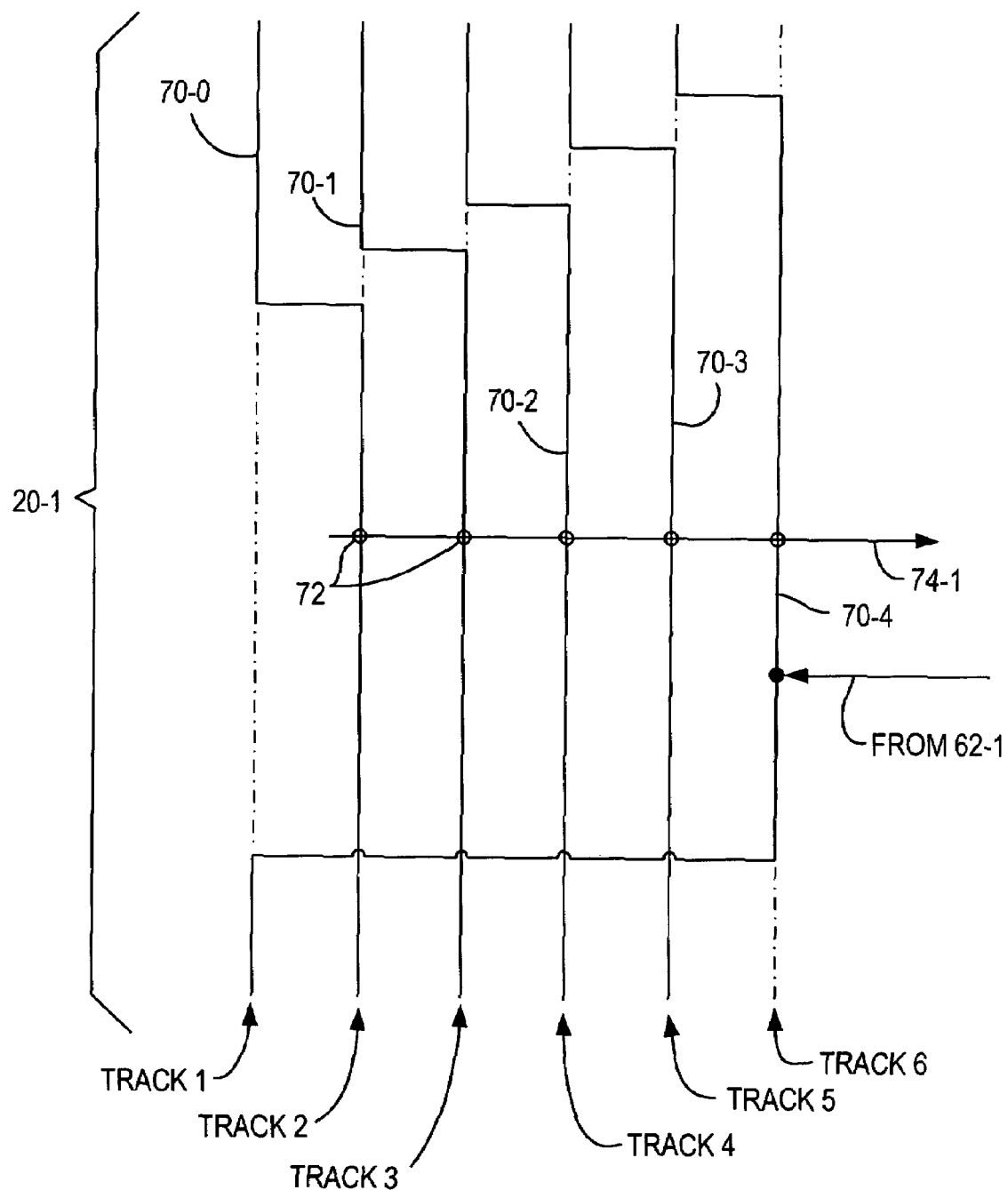
FIG. 4 is a simplified schematic block diagram of a representative portion of what is shown in FIGS. 1 and 2.

Another way to describe the clock signal distribution circuitry of the invention is with reference to how the conductors of the circuitry use conductor tracks on the integrated circuit. FIG. 4 brings this out more explicitly for one representative portion of the illustrative embodiment being described.

FIG. 4 shows six parallel conductor tracks, labelled track 1 through track 6. Portions of these tracks having no conductor segments in accordance with this invention are indicated by dotted or chain-dotted lines. This illustrative embodiment employs five actual conductors, but these conductors use portions of six tracks. Four of these conductors each occupy opposite end portions of an associated pair of adjacent ones of the tracks. For example, conductor 70-0 occupies the upper end portion of track 1 and the lower end portion of track 2. As another example, conductor 70-3 occupies the upper end portion of track 4 and the lower end portion of track 5. The fifth conductor (70-4 in this case) occupies the upper end portion of track 5, an intermediate portion of track 6, and the lower end portion of track 1. The upper and lower end portions of track 6 are not used.

The above discussion of conductors and tracks can be generalized somewhat using the general integer parameter N for the number of conductors in the clock distribution network. In the illustrative embodiment described above N is 5. The number of tracks needed in each module of the distribution circuitry is N+1 (or 6 in the illustrative embodiment discussed above). Each of N−1 of the conductors has opposite end portions in two adjacent ones of the tracks. The Nth (fifth) conductor occupies an intermediate portion of track N+1 and otherwise unoccupied end portions of the first N tracks. End portions of track N+1 are not occupied.

There are, of course, still other ways to describe the various features of the invention that are clearly shown in the drawings.

It will be understood that the foregoing is only illustrative of the principles of the invention, and that various modifications can be made by those skilled in the art without departing from the scope and spirit of the invention. For example, the numbers of various components shown and described herein are only illustrative, and other numbers or components can be used instead if desired. As just one illustration of this, each quad 20 may have more than one CMU 40, and therefore more than one reference clock input 60/62. If this is done, then distribution circuitry 70 may be expanded to support distribution of more than one such signal from each quad. The particular geometrical relationships shown herein are only illustrative and are not intended to be limiting. For example, the depicted vertical column of quads 20 can instead be a horizontal row, with conductors 70 basically running horizontally rather than vertically. Many other variations within the scope of the invention will occur to those skilled in the art.

The invention claimed is:

1. Integrated circuitry comprising:
   a plurality of circuit blocks, each including:
   clock signal source circuitry;
   clock signal utilization circuitry; and
   a module of clock signal distribution circuitry, the modules in the blocks being at least substantially identical to one another with respect to how they receive a clock signal from their respective clock signal source circuitry and connect to the module in an adjacent block to distribute a clock signal from each block to another of the blocks.

2. The circuitry defined in claim 1 wherein each of the modules comprises:
   a plurality of circuit tracks that align with the circuit tracks in another of the modules;
   first conductor circuitry that shifts conductors in the tracks in a first direction that is transverse to the tracks; and
   second conductor circuitry that shifts a conductor in a track in a second direction that is opposite the first direction, the second conductor circuitry crossing the conductors in at least one other of the tracks.

3. The circuitry defined in claim 2 wherein the first conductor circuitry is disposed between opposite first and second endpoints of the tracks in the module, and wherein the second conductor circuitry is disposed between the first conductor circuitry and the second endpoints.

4. The circuitry defined in claim 3 wherein the first conductor circuitry shifts each conductor by one track in the first direction.

5. The circuitry defined in claim 4 wherein the second circuitry shifts a conductor across all of the other conductors in the second direction.

6. The circuitry defined in claim 1 wherein the clock signal utilization circuitry comprises:
   PLL circuitry.

7. The circuitry defined in claim 6 wherein the clock signal comprises a reference clock signal for use by the PLL circuitry.

8. The circuitry defined in claim 1 wherein each of the circuit blocks further includes:
   a plurality of channels of data signal processing circuitry.

9. Serial data signal interface circuitry on an FPGA integrated circuit device comprising:
   a plurality of channels of serial data signal transmitter and/or receiver circuitry, the channels being grouped in a plurality of groups;
   reference clock signal source circuitry associated with each of the groups; and
   reference clock signal distribution circuitry for distributing a reference clock signal from each source circuitry to all of the groups; the distribution circuitry comprising a plurality of circuit modules, one of which is associated with each of the groups, the modules being substantially identical at least with respect to reception of the reference clock signal from the associated source circuitry and connection to modules in adjacent ones of the groups.

10. The circuitry defined in claim 9 wherein each of the modules comprises:
    conductors in a plurality of substantially parallel tracks, the conductors in all of the tracks shifting by one track in a first direction transverse to the tracks in passing along the length of the tracks, and the conductor in a track to one side of other tracks shifting to a track to the other side of the other tracks in passing along the length of the tracks.

11. The circuitry defined in claim 10 wherein the conductors shifting in the first direction leave a portion of a track unused, and wherein the conductor shifting from one side to the other side shifts to the track having the unused portion.

12. The circuitry defined in claim 10 wherein the number of the tracks is greater than the number of the conductors.

13. The circuitry defined in claim 12 wherein each of the tracks is used by at least one conductor along at least part of its length.

14. The circuitry defined in claim 13 wherein one of the tracks is used by only one conductor, and wherein that use occupies only an intermediate portion of that track.

15. The circuitry defined in claim 14 wherein each of the conductors occupies end portions of two different tracks, the two end portions occupied by each conductor being at opposite ends of the tracks.

16. FPGA circuitry comprising:
    a plurality of groups of channels of high-speed serial interface circuitry, each of the groups including reference clock signal input circuitry; and
    reference clock signal distribution circuitry for distributing the reference clock signal of each group to all of the groups, the distribution circuitry including a circuit module that is substantially replicated in each of the groups and that includes a connection point to the clock signal input circuitry of the associated group and connection points that can connect to the modules of groups disposed on either side of the group.

17. The circuitry defined in claim 16 wherein the distribution circuitry includes N conductors for distributing N reference clock signals, and wherein the module includes N+1 tracks for use by the conductors.

18. The circuitry defined in claim 17 wherein end portions of each of N of the tracks are occupied by different ones of the conductors, and wherein only an intermediate portion of track N+1 is occupied by one of the conductors.

19. The circuitry defined in claim 18 wherein each of N−1 of the conductors occupies opposite end portions of a respective pair of adjacent ones of N of the tracks, and wherein conductor N occupies otherwise unoccupied end portions of the N tracks and the intermediate portion of the track N+1 track.

20. The circuitry defined in claim 19 wherein the conductor N crosses the N−1 conductors to get between the N+1 track and one of the other track end portions that it occupies.

* * * * *